United States Patent [19]

Procter

[11] Patent Number: 5,158,735

[45] Date of Patent: Oct. 27, 1992

[54] ENCAPSULATING ELECTRONIC COMPONENTS

[75] Inventor: Philip J. Procter, Olean, N.Y.

[73] Assignee: The Dexter Corporation, Windsor Locks, Conn.

[21] Appl. No.: 704,665

[22] Filed: May 20, 1991

Related U.S. Application Data

[60] Continuation of Ser. No. 285,860, Dec. 16, 1988, abandoned, which is a division of Ser. No. 27,795, Mar. 19, 1987, Pat. No. 4,826,896.

[51] Int. Cl.$^5$ .................... B29C 45/14; C08K 3/34; C08L 63/00
[52] U.S. Cl. ................. 264/272.17; 264/272.18; 264/328.18; 524/790
[58] Field of Search .............. 264/272.13, 272.17, 264/331.12, 272.18, 328.18; 428/331; 357/72; 524/790

[56] References Cited

U.S. PATENT DOCUMENTS 4,681,718 7/1987 Oldham .................... 264/272.13

FOREIGN PATENT DOCUMENTS 1956066 4/1971 Fed. Rep. of Germany .
56049547 5/1981 Japan .
56144565 11/1981 Japan .
56161461 12/1981 Japan .

Primary Examiner—James Lowe
Attorney, Agent, or Firm—Fish & Richardson

[57] ABSTRACT

Encapsulating an electronic component with an encapsulating resin having a filler that includes silicon carbide to form a composite with improved thermal conductivity (e.g., greater than $25 \times 10^{-4}$ cal/cm-sec-°C.) and improved stress characteristics (e.g., a thermal shock cycle number of at least 30).

13 Claims, No Drawings

ENCAPSULATING ELECTRONIC COMPONENTS

This is a continuation of co-pending application Ser. No. 07/285,860, filed on Dec. 16, 1988, now abandoned, which is a divisional of application Ser. No. 07/027,795, filed on Mar. 19, 1987 now U.S. Pat. No. 4,826,896, issued on May 2, 1989.

BACKGROUND OF THE INVENTION

This invention relates to encapsulating electronic components.

Electronic components, e.g., integrated circuits and other semiconductor devices, diodes, resistors, resistor networks, and capacitors, are typically encapsulated in an insulating resin, e.g., epoxy resin, to which fillers, e.g., silica and alumina, have been added. Among the important properties of the encapsulating resin are high thermal conductivity and low stress generation on the underlying electronic component. Stress on the component can occur as a result of thermal cycling during use of the component ("thermal cycling stress"). Normally, improving the thermal conductivity of the encapsulating resin causes the thermal cycling stress characteristics to deteriorate and vice versa.

SUMMARY OF THE INVENTION

In general, the invention features encapsulating an electronic component with an encapsulating resin having a filler that includes silicon carbide to form a composite with improved thermal conductivity (e.g., at least $25 \times 10^{-4}$ cal/cm-sec-° C.) and improved stress characteristics (e.g., a thermal shock cycle number of at least 30).

The invention also features an encapsulating composition and an electronic component encapsulated by the above method.

In preferred embodiments, the thermal conductivity of the composite is at least $60 \times 10^{-4}$ and the thermal shock cycle number is at least 40. The filler further includes at least one of the following fillers (wt. % values based on the wt. % of the particular filler in the entire encapsulation composition): silica (10–40 wt. %); alumina (10–40 wt. %); boron nitride (1–10 wt. %); magnesium aluminosilicate (5–20 wt. %); and magnesium oxide (1–50 wt. %).

The weight percent of silicon carbide in the encapsulation composition is preferably at least 10, more preferably between 30 and 70. Generally, the weight percent of the filler is preferably at least 50.

To improve adhesion to the encapsulating resin and reduce the electrical conductivity of the composite, the filler is preferably treated with a coupling agent. Preferred coupling agents include organosilanes, organosilazanes, and organotitanates. The preferred encapsulating resin is epoxy resin.

The invention simultaneously improves the thermal conductivity and stress characteristics (as measured by the thermal shock cycle number) of conventional electronic component-encapsulating compositions using a silicon carbide-based filler. The particular values of these properties can be adjusted by adjusting the amounts and identities of the components of the filler; thus, the encapsulation composition can be tailored to its end use. The electrically conductive property of silicon carbide, which normally would be detrimental to the functioning of the encapsulated component, can be minimized through the use of an insulating coupling agent.

Other features and advantages of the invention apparent from the following description of the preferred embodiments thereof, and from the claims.

DESCRIPTION OF THE PREFERRED EMBODIMENTS

The encapsulation composition of the invention is a typical epoxy-based molding composition to which silicon carbide (in the form of a powder or discontinuous fibers) has been added. The average silicon carbide particle size is preferably between 80 and 1000 U.S. standard mesh. Preferably, the encapsulation composition also contains one or more of the following fillers: silica (fused or crystalline); alumina; boron nitride; magnesium aluminosilicate; and magnesium oxide. The total weight percent of silicon carbide and fillers in the composition preferably is about 75. The thermal conductivity of the composition is at least $25 \times 10^{-4}$ (measured according to ASTM F433-77 or ASTM C518-76). The thermal shock cycle number is at least 30. It is measured by encapsulating a 16-pin DIP (dual inline package) with a pad size of 4mm x 8mm in the encapsulation composition, and then cycling the encapsulated component between −196° C. and 260° C. The encapsulated component is maintained at each temperature extreme for 30 sec and then cycled to the other extreme in under 5 sec. The number of cycles recorded up to the point at which 50% of the material cracks is the thermal shock cycle number.

Useful epoxy-based molding compositions contain an epoxy resin having two or more oxirane rings per molecule. Suitable commercially available resins include Dow 3310 solid epoxy resin. Liquid epoxy resins, e.g., Shell EPON 828, can also be used, as well as brominated epoxy resins, e.g., Dow 6410 resin. A hardener of the novolac (e.g., Borden SD 1711) or anhydride type (e.g., trichlorophthalic anhydride) and a catalyst (preferably a tertiary amine such as triethylamine or a tertiary phosphine) are included to cure the composition once the electronic component is in place. Additional ingredients typically include flame retardants (e.g., antimony oxide), mold release agents (e.g., organic waxes), and pigments (e.g., carbon black).

A coupling agent preferably is added to the encapsulation composition to improve adhesion between the epoxy resin and the silicon carbide and other fillers. The coupling agent also improves the moisture resistance and electrical performance of the cured composition. Suitable coupling agents include organotitanates, organosilanes (described in U.S. Pat. No. 3,849,187, assigned to the same assignee as the present application, hereby incorporated by reference), and organosilazane agents (described in co-pending U.S. application, Ser. No. 936,473, filed Nov. 26, 1986 now issued as U.S. Pat. No. 4,778,907, and assigned to the same assignee as the present application, hereby incorporated by reference).

The encapsulation composition is prepared by blending the epoxy-based molding composition with the silicon carbide powder or fibers and any additional fillers until all the ingredients are thoroughly mixed (usually about 40 minutes). The composite blend is then heated in an extruder or 2-roll mill to cause the epoxy resin to liquefy and flow around the silicon carbide and other fillers, thereby wetting them. Afterwards, the composite blend is cooled and ground into appropriately sized particles (the particle size will vary depending on the intended use). Electronic components are then encapsulated in the product according to conventional processing techniques.

EXAMPLES

Fifteen encapsulation compositions with various filler ingredients were prepared according to the above-described method. Each composition contained the following ingredients (amounts given in weight percent):

| | |
|---|---|
| Epoxy resin | 12.00 |
| Brominated epoxy resin | 2.50 |
| Phenol novolac hardener | 6.00 |
| Pigment (carbon black) | 0.10 |
| Mold Release Agent | 0.20 |
| Catalyst | 0.15 |

The filler ingredients in the 15 compositions, and the resulting thermal conductivities and thermal shock cycle numbers, are summarized in Table 1. Compositions 1, 2, and 11-15 contained 1.50 wt. % antimony oxide flame retardant. All other compositions contained 2.00 wt. %.

TABLE 1

| Filler | (1) | (2) | (3) | (4) | (5) | (6) | (7) | (8) | (9) | (10) | (11) | (12) | (13) | (14) | (15) |
|---|---|---|---|---|---|---|---|---|---|---|---|---|---|---|---|
| silica | 38.48 | 25.65 | 21.30 | 21.30 | 0 | 20.65 | 15.65 | 25.65 | 25.05 | 24.85 | 0 | 15.65 | 15.65 | 15.65 | 15.65 |
| silicon carbide | 38.47 | 51.30 | 45.65 | 45.65 | 76.95 | 25.65 | 25.65 | 51.30 | 51.30 | 51.30 | 76.95 | 51.30 | 51.30 | 51.30 | 51.30 |
| alumina | 0 | 0 | 10.00 | 0 | 0 | 20.65 | 15.65 | 0 | 0 | 0 | 0 | 10.00 | 0 | 0 | 0 |
| boron nitride | 0 | 0 | 0 | 10.00 | 0 | 0 | 0 | 0 | 0 | 0 | 0 | 0 | 0 | 0 | 10.00 |
| magnesium aluminosilicate | 0 | 0 | 0 | 0 | 0 | 10.00 | 20.00 | 0 | 0 | 0 | 0 | 0 | 0 | 10.00 | 0 |
| magnesium oxide | 0 | 0 | 0 | 0 | 0 | 0 | 0 | 0 | 0 | 0 | 0 | 0 | 10.00 | 0 | 0 |
| coupling agent - silane | 0.60 | 0.60 | 0.10 | 0.10 | 0.10 | 0.10 | 0.10 | 0.10 | 0 | 0.20 | 0.60 | 0.60 | 0.60 | 0.60 | 0.60 |
| coupling agent - silazane | 0 | 0 | 0 | 0 | 0 | 0 | 0 | 0 | 0.70 | 0.70 | 0 | 0 | | 0 | 0 |
| thermal conductivity ($\times 10^{-4}$) | 37 | 59 | 65 | 62 | 78 | 40 | 38 | 57 | 56 | 56 | 77 | 67 | 71 | 65 | 70 |
| thermal shock cycle # | 45 | 55 | 35 | 50 | 70 | 100 | 150 | 50 | 55 | 50 | 70 | 30 | 50 | 50 | 70 |

Other embodiments are within the following claims. For example, other thermoset resins, e.g., polyimide, Polyester, or phenolformaldehyde, can be used rather than epoxy resin.

I claim:

1. A method of encapsulating an electronic component by encasing said component in a nonconductive composition comprising an encapsulating resin and at least 50 percent by weight of filler that includes sufficient silicon carbide particles to cause the thermal conductivity of said encapsulating composition to be at least $25 \times 10^{-4}$ cal/cm-sec-deg.C and the thermal shock cycle number to be at least 30, said silicon carbide particles consisting essentially of silicon carbide powder treated with a coupling agent to improve adhesion to said encapsulating resin and reduce the electrical conductivity of said composition.

2. The method of claim 1 wherein said coupling agent comprises an organosilane, organosilazane, or organotitanate.

3. The method of claim 1 wherein said thermal conductivity of said composite is at least $60 \times 10^{-4}$ cal/cm-sec-°C.

4. The method of claim 3 wherein the weight percent of said silica in said composition is between 10 and 40.

5. The method of claim 3 wherein the weight percent of said alumina in said composition is between 10 and 40.

6. The method of claim 3 wherein the weight percent of said magnesium aluminosilicate in said composition is between 5 and 20.

7. The method of claim 3 wherein the weight percent of said magnesium oxide in said composition is between 1 and 50.

8. The method of claim 1 wherein said thermal shock cycle number of said composite is at least 40.

9. The method of claim 1 wherein said filler further comprises silica, alumina, magnesium aluminosilicate, and magnesium oxide, or a combination thereof.

10. The method of claim 1 wherein the weight percent of said silicon carbide in said composition is at least 10.

11. The method of claim 1 wherein the weight percent of said silicon carbide in said composition is between 30 and 70.

12. The method of claim 1 wherein said encapsulating resin comprises epoxy resin.

13. The method of claim 1 wherein the weight percent of said silica in said composition is between 10 and 40, the weight percent of said alumina in said composition is between 10 and 40 the weight percent of said magnesium aluminosilicate in said composition is between 5 and 20, and the weight percent of said magnesium oxide in said composition is between 1 and 50.

* * * * *